United States Patent
Riding et al.

[11] Patent Number: 6,083,811
[45] Date of Patent: Jul. 4, 2000

[54] METHOD FOR PRODUCING THIN DICE FROM FRAGILE MATERIALS

[75] Inventors: Alan J. Riding, Severn; H. Wayne Jones; Leonard Pennisi, both of Baltimore, all of Md.

[73] Assignee: Northrop Grumman Corporation, Los Angeles, Calif.

[21] Appl. No.: 08/597,762

[22] Filed: Feb. 7, 1996

[51] Int. Cl.[7] .......................... H01L 21/301; H01L 21/46; H01L 21/78
[52] U.S. Cl. .......................... 438/460; 438/464; 438/416
[58] Field of Search .................................... 438/416, 460, 438/464, 977

[56] References Cited

U.S. PATENT DOCUMENTS

| | | | |
|---|---|---|---|
| 3,559,282 | 2/1971 | Lesk | 438/464 |
| 3,924,323 | 12/1975 | Trevail et al. | 438/464 |
| 5,071,792 | 12/1991 | VanVonno et al. | 438/464 |
| 5,081,061 | 1/1992 | Rouse et al. | 438/977 |
| 5,219,796 | 6/1993 | Quinn et al. . | |
| 5,266,528 | 11/1993 | Yamada | 438/464 |
| 5,268,065 | 12/1993 | Grupen-Shemansky | 438/977 |
| 5,273,940 | 12/1993 | Sanders | 438/977 |
| 5,275,958 | 1/1994 | Ishikawa | 438/464 |
| 5,302,554 | 4/1994 | Kashiwa et al. . | |
| 5,314,844 | 5/1994 | Imamura . | |
| 5,324,687 | 6/1994 | Wojnarowski | 438/977 |
| 5,352,249 | 10/1994 | Vollaro . | |
| 5,362,681 | 11/1994 | Roberts, Jr. et al. | 438/464 |
| 5,369,060 | 11/1994 | Baumann et al. | 438/460 |
| 5,457,072 | 10/1995 | Tamaki et al. | 438/464 |
| 5,478,782 | 12/1995 | Satoh et al. . | |
| 5,500,389 | 3/1996 | Lee et al. | 438/416 |
| 5,527,744 | 6/1996 | Mignardi et al. | 438/464 |
| 5,552,345 | 9/1996 | Schrantz et al. | 438/460 |
| 5,597,767 | 1/1997 | Mignardi et al. | 438/464 |
| 5,804,495 | 9/1998 | Saito et al. . | |
| 5,888,883 | 3/1999 | Sasaki et al. . | |

Primary Examiner—Kevin M. Picardat
Assistant Examiner—D. M. Collins
Attorney, Agent, or Firm—Walter G. Sutcliff

[57] ABSTRACT

Thin dice of fragile material are formed by making saw cuts in a front surface of a body of fragile material. The saw cuts define the thin dice, and have a depth equal to the desired thickness of the thin dice plus about 1 mil. A support film is then applied to the front surface of the body of fragile material. Using conventional equipment, the back surface of the body of fragile material, opposite the front surface, is ground. The grinding operation reduces the thickness of the body to the desired thickness for the thin dice. Due to the depth of the saw cuts, the grinding process exposes these saw cuts creating the individual thin dice having the desired thickness.

11 Claims, 2 Drawing Sheets

METHOD FOR PRODUCING THIN DICE FROM FRAGILE MATERIALS

BACKGROUND OF THE PRESENT INVENTION

1. Field of the Invention

The present invention relates to a method for producing thin dice from fragile materials such as semiconductor materials, quartz, sapphire, ceramics, etc.

2. Description of the Related Art

There are several reasons for producing thin chips or dice out of fragile materials. A thin die is a die having a thickness of 4 mils (0.004 inches) or less, and fragile materials include semiconductor materials, quartz, sapphire, ceramics, etc. Thin chips have lower thermal impedances than their thicker counter-parts, an important factor in high power applications. Additionally, thin dice encounter less stress due to mismatches in thermal coefficients of expansion. Thin dice also allow for thinner packaging. Accordingly, thin semiconductor dice simplify the manufacture of "Smart-Cards." Besides Smart-Cards, a demand for thin dice exists in applications such as high power microprocessors, optical sensors, ultra-thin semiconductor packages, crystal oscillators, magnetic heads for disc drives, microwave transistors, etc.

Several different methods exist for forming thin semiconductor dice. Typically, a semiconductor wafer having devices formed thereon is thinned by grinding, and then the thin wafer is diced. U.S. Pat. No. 5,268,065 to Grupen-Shemansky discloses such a method for producing thin semiconductor dice. Several problems arise when dicing a thin wafer. The dicing is performed by making saw cuts along the wafer between the semiconductor devices to form semiconductor dice or chips. When making saw cuts on a thin semiconductor wafer, however, chip outs can occur. Other problems such as wafer or die cracking and ragged chip edges are encountered when making saw cuts along a thin wafer. To reduce the occurrence of chip outs and other problems, the speed with which the saw cuts are made must be reduced to 0.25 inches per second or less. Even then, however, chip outs, ragged edges, and wafer or die cracking may occur. By contrast, these problems do not arise when making saw cuts in a semiconductor wafer of normal thickness.

U.S. Pat. No. 5,071,792 to VanVonno discloses another process for forming thin semiconductor dice. In the VanVonno process, grooves are formed in the semiconductor wafer, and these grooves are filled with a grind resistant material such as silicon nitride. VanVonno inverts the wafer and fixes the grooved surface of the wafer to a substrate using wax. VanVonno then grinds the semiconductor surface opposite the grooves until reaching the grind resistant material. The grind resistant material is then etched away. VanVonno then melts the wax to obtain the individual semiconductor dice. Unfortunately, the individual dice move during the wax melting process destroying the known position and alignment of the dice. This, consequently, makes further handling and processing of the dice extremely difficult.

U.S. Pat. No. 5,275,958 to Ishikawa discloses a method for producing semiconductor chips. In Ishikawa grooves are formed in a first surface of the semiconductor wafer, and metal is deposited in the grooves. The wafer is then inverted, and grooves, matching the groove pattern formed in the first surface, are formed in a second surface of the wafer opposite the first surface. The grooves in the second surface expose the metal deposited in the grooves of the first surface. Ishikawa then deposits metal in the grooves formed in the second surface. Dicing is carried out by cutting the metal which joins the individual dice. Consequently, sections of ragged metal line the chip edges.

U.S. Pat. No. 5,273,940 to Sanders discloses a method of forming a multiple chip package with thinned semiconductor chips. In Sanders, a plurality of chips are mounted to a substrate, semiconductor device side down. An encapsulation material is placed on the surface of the substrate to protect the surface from exposure to the external environment. Sanders then thins the semiconductor chips by grinding the exposed surface of the semiconductor chips.

U.S. Pat. No. 5,302,554 to Kashiwa discloses a method of producing thin semiconductor chips. In Kashiwa, grooves are formed in a semiconductor wafer. Kashiwa then grinds the surface opposite the grooves to reduce the thickness of the semiconductor wafer. The grooves, however, are not exposed. A plated heat sink layer is then formed on the ground surface of the semiconductor wafer, and individual heat sinks are formed on the plated heat sink layer corresponding to the individual dice. A dicing tape is then applied to the individual heat sinks, and the semiconductor wafer is diced along the grooves.

U.S. Pat. No. 5,324,687 to Wojnarowski discloses a method for thinning integrated circuit chips for lightweight packaged electronic systems. In Wojnarowski, individual dice are placed into pockets formed in a substrate. Wojnarowski then applies an adhesive layer over the surface of the substrate having the pockets formed therein. Wojnarowski then grinds the surface of the substrate opposite the surface having the pockets formed therein. During grinding, enough substrate is removed to expose the individual dice in their respective pockets. Grinding continues to thin the individual dice.

Each of the methods discussed above either dices a thin semiconductor wafer, requires handling of individual dice prior to thinning, or requires a complex series of processing steps to form thin semiconductor dice.

SUMMARY OF THE INVENTION

One object of the present invention is to provide a method of producing thin dice out of a fragile material which does not suffer from the drawbacks discussed above. For instance, the method of producing thin dice according to the present invention substantially eliminates the occurrence of chip outs, die cracking and wafer cracking.

A further object of the present invention is to provide a method of producing thin dice out of a fragile material which does not have ragged edges.

Another object of the present invention is to provide a simple method of producing thin dice out of a fragile material.

An additional object of the present invention is to provide a method of producing thin dice out of a fragile material which, upon completion, allows for easy handling of the thin dice.

These and other related objects are achieved by providing a method of producing thin dice out of a fragile material, comprising: (a) forming grooves in a first surface of a body of fragile material, said body also having a second surface opposite said first surface; (b) applying a support film to said first surface; and (c) removing fragile material from said second surface to thin said body, said step (c) removing enough of said fragile material from said second surface to expose said grooves and form a plurality of thin dice.

The objects of the present invention are also achieved by providing a method of producing thin dice out of a fragile material, comprising: (a) forming grooves in a first surface of a body of fragile material, said body also having a second surface opposite said first surface; (b) applying a non-metallic support film to said first surface; and (c) thinning said body by removing fragile material from said second surface to expose said grooves.

Other objects, features, and characteristics of the present invention; methods, operation, and functions of the related elements of the structure; combination of parts; and economies of manufacture will become apparent from the following detailed description of the preferred embodiments and accompanying drawings, all of which form a part of this specification, wherein like reference numerals designate corresponding parts in the various figures.

DETAILED DESCRIPTION OF THE PREFERRED EMBODIMENTS

The method of producing thin dice out of a fragile material according to the present invention will be described referring to FIGS. 1–6. For purposes of discussion only, a semiconductor material, has been chosen as the fragile material in FIGS. 1–6. It should be understood, however, that any fragile material may be used.

Figure 1:
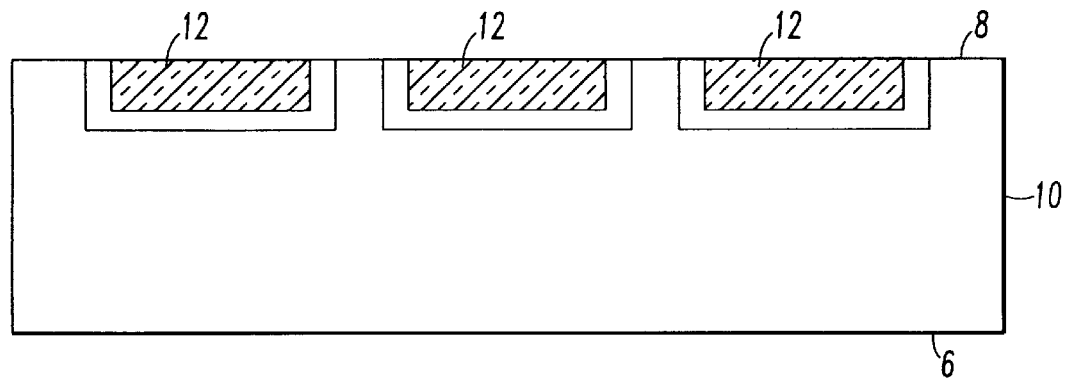
FIG. 1 illustrates a semiconductor wafer having semiconductor devices formed thereon.

FIG. 1 illustrates a semiconductor wafer 10 having semiconductor devices 12 formed in and/or on a front surface 8. The semiconductor wafer 10 also has a back surface 6 opposite the front surface 8. The method of the present invention may also be applied to unprocessed fragile material, or fragile material at any stage of processing. Additionally, the semiconductor wafer 10 may be silicon based, GaAs based, or any other type of semiconductor material.

Figure 2:
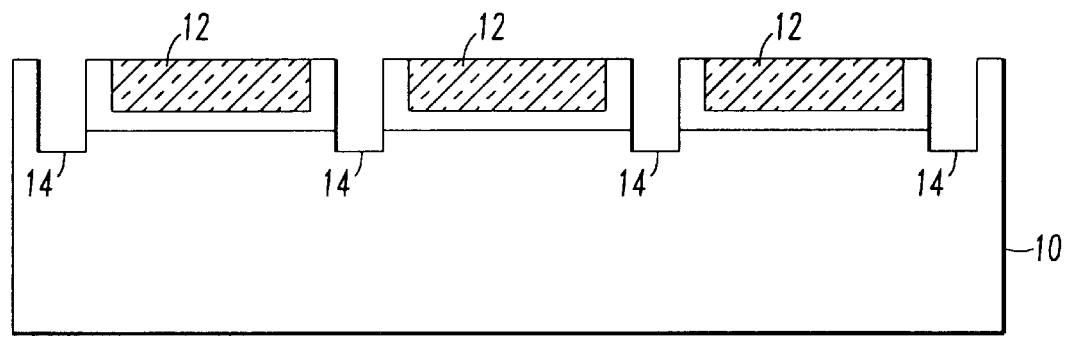
FIGS. 2–6 illustrate the results of the process steps of the method for producing thin dice out of a fragile material according to the present invention.

The back surface 6 of the semiconductor wafer 10 is applied to a conventional dicing film, such as a polyvinyl chloride film, used for conveying a semiconductor wafer through a conventional dicing system such as a K and S 797 Automated Wafer Dicing System. Using a conventional dicing system, saw cuts defining the individual dice are formed in the semiconductor wafer 10 to a depth equal to the desired die thickness plus about 1 mil. FIG. 2 illustrates the resulting semiconductor wafer 10 having saw cuts 14 formed therein.

Since the formation of such saw cuts using a conventional dicing system is well-known to those skilled in the art, the process of forming those saw cuts has not been described in detail. Conventional dicing systems form saw cuts having a width of 30 microns, but since this thickness depends on the thickness of the blade of the dicing system, the width of the saw cuts is adjustable by changing the blade of the dicing system. Furthermore, since chip outs and other problems associated with making saw cuts in a thin wafer are not encountered when making saw cuts in the semiconductor wafer 10 of normal thickness, the speed with which these cuts are made can be increased. Accordingly, in a preferred embodiment, the saw cuts are made at a speed of 0.5 to 1.0 inches per second; preferably at 0.5 inches per second.

In subsequent processing steps, the semiconductor wafer 10 will be mounted to a vacuum chuck 30 (a well-known device), and the back surface 6 will be ground to obtain semiconductor dice of the desired thickness. To protect the semiconductor devices 12 and the vacuum chuck 30 from damage, a backgrinding film 16 (see FIG. 3) is applied to the front surface 8 of the semiconductor wafer. The backgrinding film 16 covers the semiconductor devices 12, and thus protects the semiconductor devices 12 when the front surface 8 is placed on the vacuum chuck 30. Furthermore, upon completion of the grinding process, semiconductor dice having a thickness of 4 mil or less will have been formed. Without the backgrinding film 16, the grinding wheel of the grinding device will be 4 mil or less from the vacuum chuck 30; a fairly expensive piece of equipment. Since 4 mil or less does not provide a great margin of error should something go wrong during the grinding process, the backgrinding film 16 also provides separation between the grinding wheel of the grinding device and the vacuum chuck 30.

Figure 3:
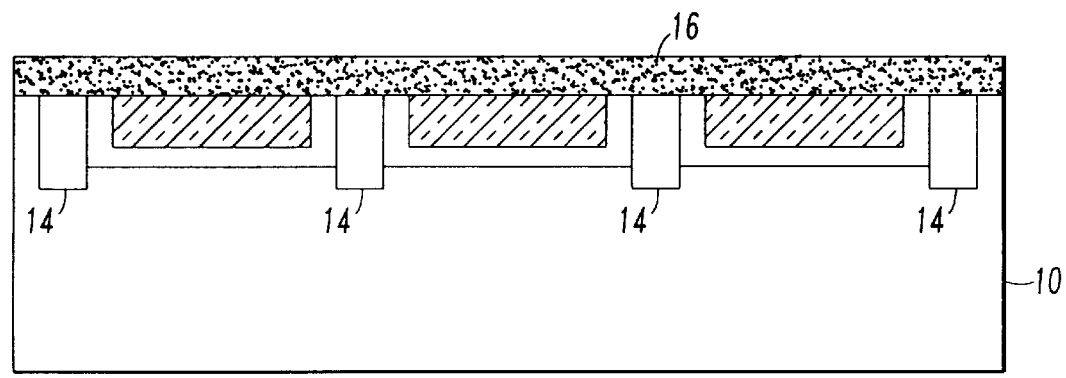
Figure 4:
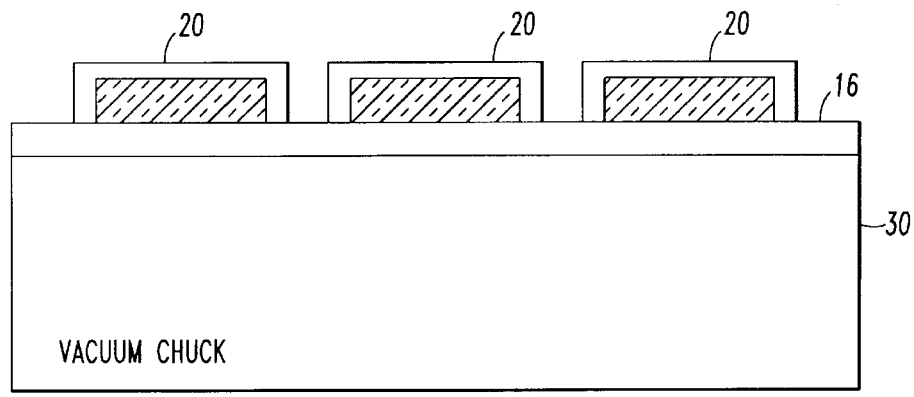

As shown in FIG. 3, a backgrinding film 16 is applied to the front surface 8 of the semiconductor wafer 10. Any non-stretching film may be used as the backgrinding film 16, such as part no. 1002 manufactured by Ultron Systems Inc. A non-stretching film is used so that when the semiconductor wafer 10 is released from the vacuum chuck 30, the backgrinding film 16 does not contract. If the backgrinding film 16 were to contract, the individual dice could be damaged by impacting one another as the backgrinding film 16 contracts.

The separation between the vacuum chuck 30 and the grinding wheel can be increased by applying additional backgrinding layers, or by applying other films to the backgrinding film 16. Removing these additional layers upon completion of the grinding operation, however, proves difficult. Therefore, in a preferred embodiment, the need for additional films has been eliminated.

Figure 5:
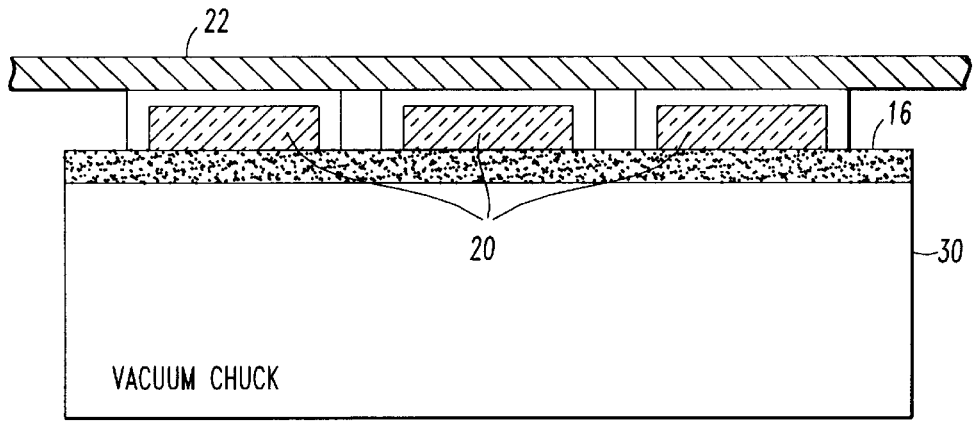

Next, the semiconductor wafer 10 is mounted on a vacuum chuck 30 by inverting the semiconductor wafer 10 so that the backgrinding film 16, as opposed to the back surface 6, contacts the vacuum chuck 30. The vacuum chuck 30 is then used to position the semiconductor wafer in a conventional grinding device such as a Muller MPS2R300 Wafer Grinder. The back surface 6 of the semiconductor wafer 10 is then ground until the desired die thickness is obtained. Since the saw cuts were formed to a depth greater than the desired die thickness, the grinding exposes those saw cuts creating the individual dice 20 as shown in FIG. 5.

Figure 6:
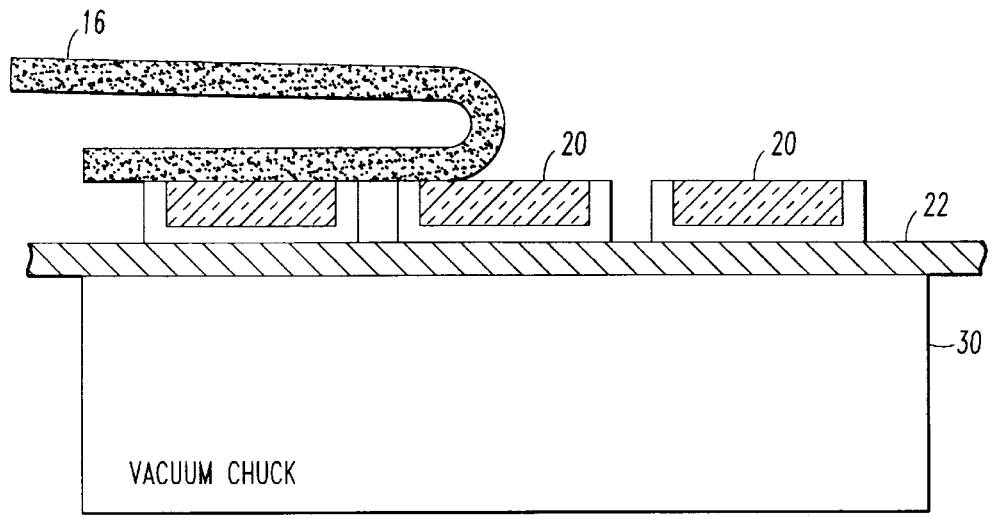

The individual dice 20 are now ready for use or further processing. In their present condition, mounted to the backgrinding film 16, however, handling of the individual dice 20 proves difficult. Therefore, a dicing film 22, such as used when making the saw cuts, is applied to the back surface 6 of the individual dice 20 as shown in FIG. 5. The dicing film 22 is then mounted on the vacuum chuck 30. An operator can now peel off the backgrinding film 16 as shown in FIG. 6 since greater adhesion exists between the individual dice 20 and the dicing film 22 than between the backgrinding film 16 and the individual dice 20.

Furthermore, upon removal of the backgrinding film 16, the individual dice 20 mounted semiconductor device 12 side up on the dicing film 22 are in a conventional semiconductor die handling arrangement. In this state the semiconductor dice 20 can be sorted and handled in any well-known method such as pick and place using any well-known handling equipment such as a Viking separating Machine.

While the invention has been described in connection with what is presently considered the most practical and preferred embodiments, it is to be understood that the invention is not limited to the disclosed embodiments, but on the contrary, is intended to cover various modifications and equivalent arrangements included within the spirit and scope of the appended claims.

We claim:

1. A method of producing thin dice out of a fragile material, comprising:
   (a) forming grooves in a first surface of a body of fragile material, said body also having a second surface opposite said first surface;
   (b) applying a support film to said first surface;
   (c) removing fragile material from said second surface to thin said body, said step (c) removing enough of said fragile material from said second surface to expose said grooves and form a plurality of thin dice; and
   (d) removing said support film.

2. The method of claim 1, wherein said step (a) forms said grooves by making saw cuts in said first surface.

3. The method of claim 1, wherein said step (b) applies a non-metallic support film.

4. The method of claim 1, wherein said step (b) applies a backgrinding film to said first surface, said backgrinding film being a non-contracting film.

5. The method of claim 4, wherein said step (b) applies several layers of backgrinding film.

6. The method of claim 1, wherein said step (c) removes said fragile material from said second surface by grinding.

7. The method of claim 1, wherein said step (d) removes said support film by peeling said support film off said first surface of said plurality of semiconductor dice.

8. The method of claim 1, wherein said step (d) comprises the substeps of:
   (d1) applying a handling film to said second surface of said plurality of thin dice, said handling film having greater adhesion to said plurality of thin dice than between said support film and said plurality of thin dice; and
   (d2) peeling said support film off said first surface of said plurality of thin dice.

9. The method of claim 1, wherein
   said step (b) applies a backgrinding film to said first surface, said backgrinding film being a non-contracting film; and
   said step (d) includes the substeps of,
   (d1) applying a handling film to said second surface of said plurality of thin dice, said handling film having greater adhesion to said plurality of thin dice than between said backgrinding film and said plurality of thin dice; and
   (d2) peeling said backgrinding film off said first surface of said plurality of thin dice.

10. The method of claim 1, wherein said body of fragile material is a semiconductor wafer.

11. The method of claim 1, wherein said body of fragile material is a body of one of quartz, sapphire, and ceramic.

* * * * *